US012794257B2

(12) United States Patent
Ongyanco et al.

(10) Patent No.: US 12,794,257 B2
(45) Date of Patent: Nov. 10, 2026

(54) ADAPTIVE OUTPUT START-UP RAMP

(71) Applicant: Advanced Energy Industries, Inc., Denver, CO (US)

(72) Inventors: Donald Cedrick Ongyanco, Quezon City (PH); Arvin San Juan, Carmona (PH); Marlon Manadong, Quenzon City (PH); Ledixor Ong, Taytay (PH); Oliver Mallari, Angeles City (PH)

(73) Assignee: AES Global Holdings PTE. Ltd., Singapore (SG)

( * ) Notice: Subject to any disclaimer, the term of this patent is extended or adjusted under 35 U.S.C. 154(b) by 190 days.

(21) Appl. No.: 18/170,127

(22) Filed: Feb. 16, 2023

(65) Prior Publication Data

US 2024/0283272 A1 Aug. 22, 2024

(51) Int. Cl.

| | |
|---|---|
| ***H02J 7/90*** | (2026.01) |
| ***G01R 31/3835*** | (2019.01) |
| ***H02J 7/00*** | (2026.01) |
| ***H02J 7/50*** | (2026.01) |
| ***H02J 7/80*** | (2026.01) |
| ***H02M 1/42*** | (2007.01) |
| ***H02M 3/158*** | (2006.01) |

(52) U.S. Cl.

CPC .......... *H02J 7/933* (2026.01); *G01R 31/3835* (2019.01); *H02J 7/50* (2026.01); *H02J 7/80* (2026.01); *H02J 7/855* (2026.01); *H02M 3/158* (2013.01); *H02J 2207/20* (2020.01); *H02M 1/4208* (2013.01)

(58) Field of Classification Search

None

See application file for complete search history.

(56) References Cited

U.S. PATENT DOCUMENTS

| | | | | |
|---|---|---|---|---|
| 6,459,175 | B1 * | 10/2002 | Potega | H02J 9/061 307/132 M |
| 2012/0182003 | A1 * | 7/2012 | Flaibani | H02M 3/156 323/284 |
| 2018/0069407 | A1 * | 3/2018 | Herrera | H02J 7/62 |
| 2022/0155383 | A1 * | 5/2022 | Yang | G01R 19/16566 |
| 2022/0261023 | A1 * | 8/2022 | Dasgupta | B64D 31/00 |
| 2022/0376598 | A1 * | 11/2022 | Lewis | H02M 1/08 |
| 2023/0133068 | A1 * | 5/2023 | Wiegman | B60L 53/16 320/109 |

FOREIGN PATENT DOCUMENTS

| | | |
|---|---|---|
| CN | 108432083 A | 8/2018 |
| TW | 201316653 A | 4/2013 |

* cited by examiner

*Primary Examiner* — Menatoallah Youssef
*Assistant Examiner* — Khareem E Almo

(57) ABSTRACT

A power supply comprises a power converter configured to be coupled with a battery voltage source and configured to convert an input voltage supplied by the battery voltage source to an output voltage for supply to a load. The power converter comprises a controller configured to determine a state of charge of the battery voltage source, determine a startup time over which a voltage level of the input voltage is to be ramped to a voltage level of a target output voltage, determine a ramp-up rate based on the state of charge and the startup time, and control the power converter to ramp the output voltage from the voltage level of the input voltage to the voltage level of the target output voltage based on the ramp-up rate.

14 Claims, 4 Drawing Sheets

- Prior art -

ADAPTIVE OUTPUT START-UP RAMP

TECHNICAL FIELD

Aspects of the disclosure relate to output power distribution, and more particularly to power supply from a battery backup unit (BBU).

BACKGROUND

Datacenter applications may utilize BBU systems. It is common for this system to have multiple BBU modules connected in parallel for high power capability and redundancy. BBU modules are normally housed inside a shelf and can also be connected in parallel to achieve much higher power.

The battery inside the BBU modules can have different state of charges (SoC) at a given time depending on the previous use case and battery characteristics. Depending on the SOC level, the voltage of a battery increases or decreases. For regulated BBU output voltage, BBUs having different SOCs can have difference in timing to reach a certain regulation point as the output voltage needs to ramp as soon as the discharger is turned ON. The SOC can be considered to be the starting point of the ramp. A BBU with a low battery state of charge (e.g., 20% SoC) will take a longer ramp-up time to reach a target voltage than a BBU with high battery state of charge (e.g., 100% SoC) because the voltage difference between the SoC and the target voltage is larger at the lower SoC. The ramp-up time difference may trigger over current protection (OCP) in the first BBU since it reaches the target voltage sooner. In this case, it can momentarily supply a majority if not all of the load while the other BBUs catch up. Supplying all of the load, even for a small period of time, can overextend the BBU's capacity and cause it to enter the OCP mode.

SUMMARY

In accordance with one aspect of the present disclosure, a power supply comprises a battery voltage source and a power converter coupled with the battery voltage source. The power converter is configured to convert an input voltage supplied by the battery voltage source to an output voltage for supply to a load. The power converter comprises a controller configured to determine a state of charge of the battery voltage source, determine a startup time over which a voltage level of the input voltage is to be ramped to a voltage level of a target output voltage, determine a ramp-up rate based on the state of charge and the startup time, and control the power converter to ramp the output voltage from the voltage level of the input voltage to the voltage level of the target output voltage based on the ramp-up rate.

In accordance with another aspect of the present disclosure, a power supply unit comprises a first battery backup unit and a second battery backup unit. Each of the first and second battery backup units comprises a battery, a power converter, and a controller. The power converter is configured to convert a voltage of the battery into an output voltage. The controller is configured to determine a voltage of the battery, determine a ramp-up time, determine a ramp-up rate based on the voltage of the battery and the ramp-up time, and control the power converter to ramp the output voltage to a target voltage from the voltage of the battery.

In accordance with another aspect of the present disclosure, a method of controlling a startup of multiple battery backup units (BBUs) of a power supply comprises determining a startup time, determining a voltage of a battery of a first BBU, and determining a voltage of a battery of a second BBU. The method also comprises determining a ramp-up rate of the first BBU based on the voltage of the battery of the first BBU and the startup time and comprises determining a ramp-up rate of the second BBU based on the voltage of the battery of the second BBU and the startup time. The method further comprises controlling the first BBU to start up over the startup time based on the ramp-up rate of the first BBU to produce a target output voltage at an end of the startup time and controlling the second BBU to start up over the startup time based on the ramp-up rate of the second BBU to produce the target output voltage at the end of the startup time.

BRIEF DESCRIPTION OF THE DRAWINGS

The drawings illustrate embodiments presently contemplated for carrying out the invention.

In the drawings.

Figure 1:
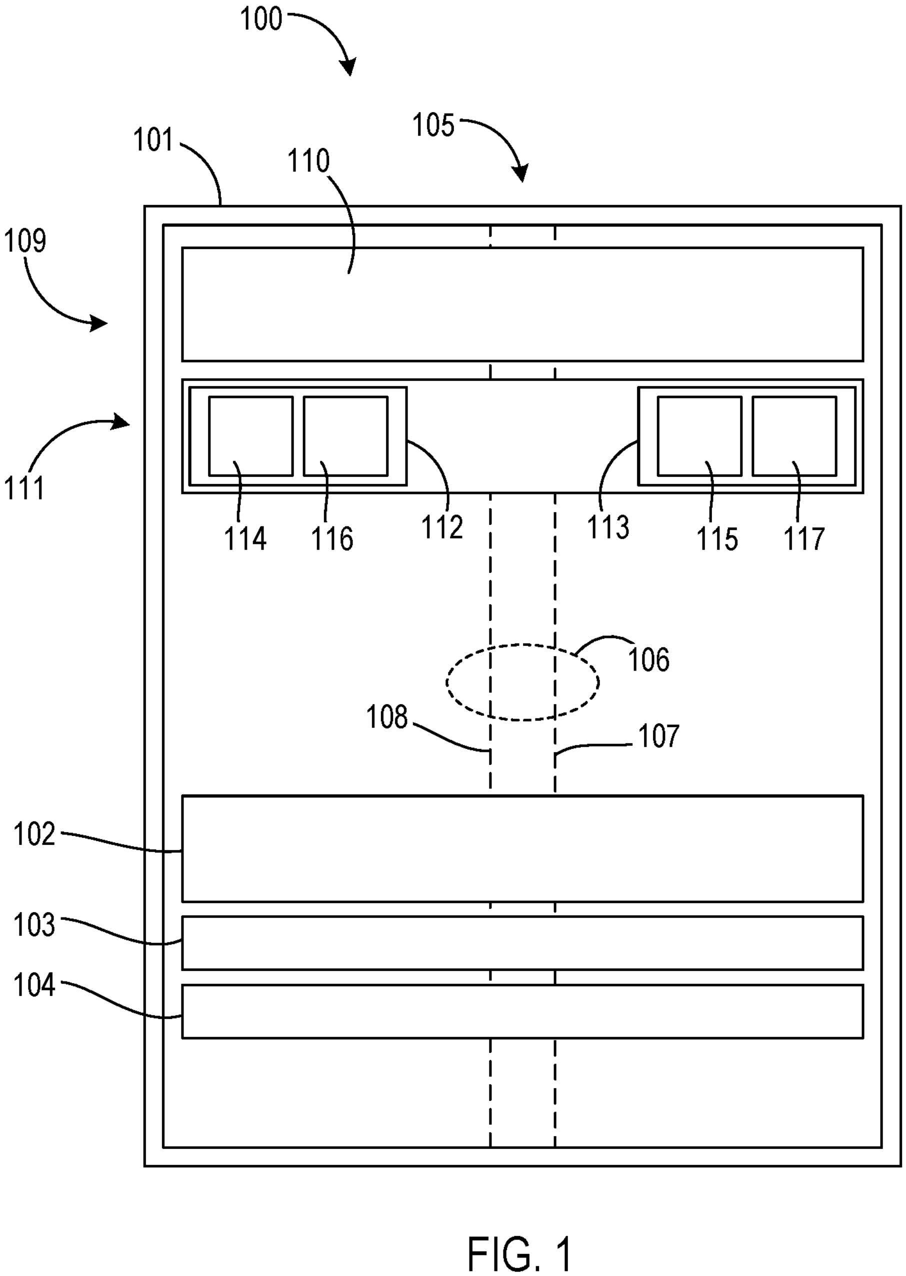
FIG. 1 illustrates a block diagram of an equipment rack according to an embodiment.

While the present disclosure is susceptible to various modifications and alternative forms, specific embodiments thereof have been shown by way of example in the drawings and are herein described in detail. It should be understood, however, that the description herein of specific embodiments is not intended to limit the present disclosure to the particular forms disclosed, but on the contrary, the intention is to cover all modifications, equivalents, and alternatives falling within the spirit and scope of the present disclosure. Note that corresponding reference numerals indicate corresponding parts throughout the several views of the drawings.

DETAILED DESCRIPTION

Examples of the present disclosure will now be described more fully with reference to the accompanying drawings. The following description is merely exemplary in nature and is not intended to limit the present disclosure, application, or uses.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Although the disclosure hereof is detailed and exact to enable those skilled in the art to practice the invention, the physical embodiments herein disclosed merely exemplify the invention which may be embodied in other specific structures. While the preferred embodiment has been described, the details may be changed without departing from the invention, which is defined by the claims.

FIG. 1 illustrates a block diagram of an equipment rack 100 according to an embodiment. Equipment rack 100 includes an enclosure 101 capable of housing and supporting multiple pieces of equipment 102, 103, 104 such as computing, telecommunication, audio, and/or video equipment and the like. The enclosure 101 may be configured to accept specific sizes of equipment in designated locations or may be configured to allow the installation of equipment at any of various vertical positions to accommodate multiple equipment layouts.

The energy to power the equipment 102, 103, 104 is provided by a central power distribution system (PDS) 105 of the rack. PDS 105 includes a rack bus system 106 having two or more power rails 107, 108 generally located at the rear of the enclosure 101 for providing power into the rear of each piece of equipment 102, 103, 104. In one embodiment, the rack bus system 106 can be a DC power system providing a neutral power rail 107 and a voltage rail 108 having a positive or negative voltage with respect to the neutral power rail 107.

The PDS 105 receives power from one or more power shelves 109 having one or more power supply units (PSUs) 110 configured to receive AC or DC power and convert the received power to a DC output power for powering the equipment 102, 103, 104. The voltage outputs of multiple PSUs 110, if used, may be coupled together and tied to the PDS 105 to share the power load of the PDS 105. For example, the PDS 105 may be designed to receive a desired power from the one or more power shelves 109 with a target DC system voltage (e.g., 48V DC). Accordingly, a number of PSUs 110, each providing a portion of the total desired power, may be installed in the power shelf 109 and coupled together to provide the desired power. The number of PSUs 110 to be installed can depend on the output capacity of each PSU 110.

The equipment rack 100 has a battery backup shelf 111 including one or more battery backup units (BBUs) to provide power during high power demand or as backup supplied in the case of input power loss to the PSU 110. The illustrated equipment rack 100 includes two BBUs 112, 113 for redundancy and for sharing the power load of the PDS 105 as needed. Each BBU 112, 113 includes a DC-to-DC power supply 114, 115 and a DC voltage supply 116, 117 provided by one or more DC batteries. In one embodiment, the batteries 116 have a maximum state of charge (SoC) that is less than the target DC system voltage. As described above, the target DC system voltage of the rack bus system 106 may be 48V DC in one example. The maximum voltages or SoC of the batteries 116 may therefore be near 42V in this example. When used to provide power to the rack bus system 106, the power supplies 114 include a boost converter that boosts the voltages of the batteries 116 to the target DC system voltage. Alternatively, the power supplies 114 may include a buck/boost converter operating in the boost mode to generate the target DC system voltage.

Figure 2:
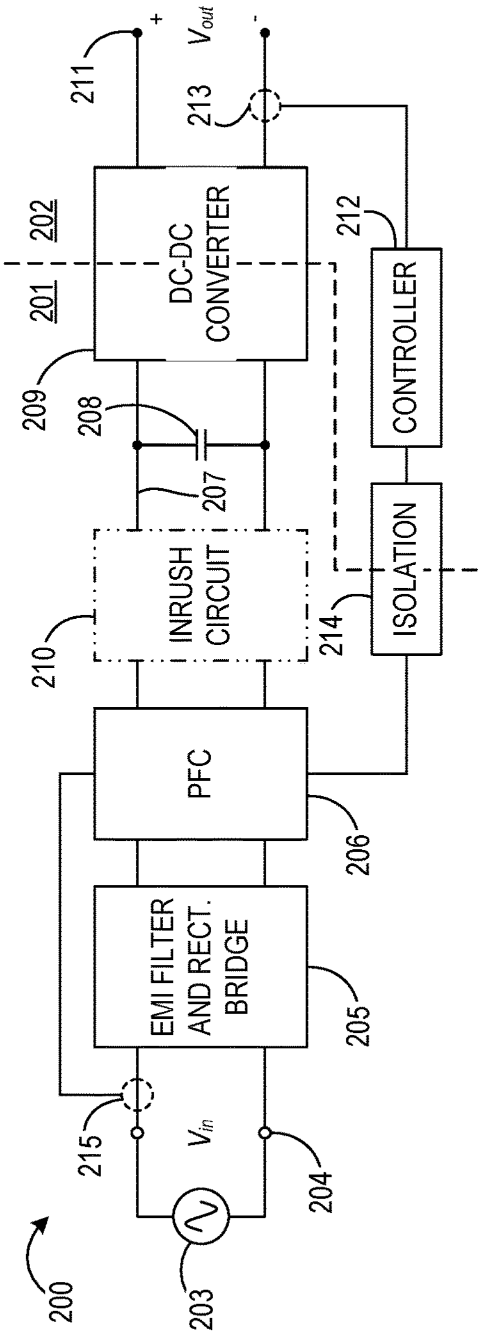
FIG. 2 illustrates a block diagram of a plurality of elements of an exemplary AC-to-DC power supply used as the PSU of FIG. 1 according to an embodiment.

FIG. 2 illustrates a block diagram of a plurality of elements of an exemplary AC-to-DC power supply 200 used as the PSU 110 of FIG. 1 according to an embodiment. The power supply 200 has a primary side 201 and a secondary side 202. The primary side 201 includes a voltage input 203 coupled to receive input voltage from an AC source 204 such as a power grid. An EMI filter and rectification bridge assembly 205 coupled to the voltage input 203 is configured to filter high frequency electromagnetic noise present on the voltage input 203 and to rectify an AC voltage into a DC voltage. In one embodiment, the EMI filter operates to filter electromagnetic noise on the incoming AC voltage and provide the filtered voltage to the rectification bridge for providing the DC output. A power factor correction circuit 206 such as contemplated herein is coupled to receive the DC voltage output from the rectification bridge 205 and to boost the DC voltage to a higher value for supply to a primary side voltage bus 207 coupled to a bulk capacitor 208 and to a DC-DC converter 209. An inrush circuit 210 (shown in phantom) is optionally provided to reduce the effects of current spikes in the energy provided by the PFC circuit 206. The DC-DC converter 209 may be a switched mode buck converter to convert the voltage on the primary side voltage bus 207 into a lower output voltage for supply to a load (not shown) coupled to a voltage output 211. As illustrated, the DC-DC converter 209 is coupled to both the primary side 201 and the secondary side 202 and includes one or more isolation components (not shown) for isolating the primary and secondary sides 201, 202. The voltage output 211 is couplable to the rack bus system 106 of FIG. 1 for supplying power to the equipment 102, 103, 104.

A feedback controller 212 is coupled to a current sensor 213 and is configured to provide a feedback signal to the PFC circuit 206 via an isolation component 214 indicating a value of the output current. An input sensor 215 configured to sense a voltage or current of the incoming AC voltage may be coupled to provide the sensed voltage/current to the PFC circuit 206. The feedback signals based on the output current and the input voltage and/or current are used to control a conduction mode of the PFC circuit 206.

Figure 3:
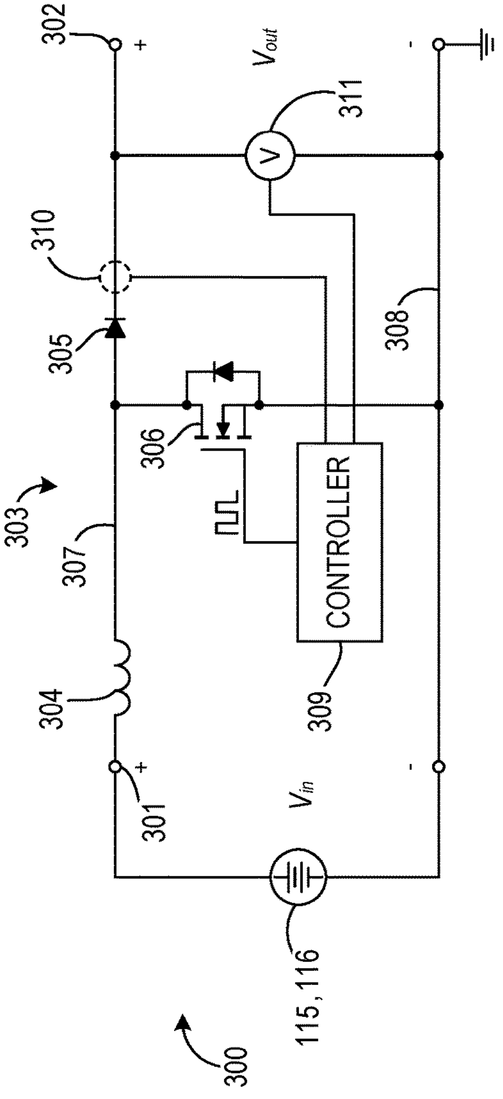
FIG. 3 illustrates a boost converter circuit for the DC-to-DC power supply of FIG. 1 according to an embodiment.

FIG. 3 illustrates a boost converter circuit 300 for the DC-to-DC power supply 114 of FIG. 1 according to an example. The boost converter circuit 300 includes a DC voltage input 301 and a DC voltage output 302. The DC voltage input 301 is coupled to receive the DC output voltage from the battery 116 of FIG. 1, and the DC voltage output 302 is coupled to supply a DC output voltage to the rack bus system 106 of FIG. 1. Between the DC voltage input 301 and DC voltage output 302, a boost circuit 303 is configured to boost the input voltage. The boost circuit 303 includes an inductor 304 coupled in series with a rectifying device (e.g., a diode) 305 between the DC voltage input and output 301, 302. A controllable power switch 306 (e.g., a metal-oxide semiconductor field effect transistor (MOSFET)) is coupled between a positive voltage node 307 coupling the inductor 304 in series with the diode 305 and a second voltage node 308 such as a ground node. Through appropriate control of the conduction and non-conduction modes of the switch 306 via a controller 309, the boost circuit 303 boosts the DC input voltage on the DC voltage input 301 to a higher DC voltage (e.g., the target DC system voltage) for output by the DC voltage output 302. The controller 309 may be coupled with a current sensor 310 and/or a voltage sensor 311 to provide feedback input for controlling the switch 306. The boost converter circuit 300 illustrated in FIG. 3 is merely an example of one type of boost converter circuit. Embodiments of this disclosure contemplate any boost converter capable of converting the voltage of the battery 116 to the target DC system voltage and may thus take other forms not illustrated herein.

Figure 4:
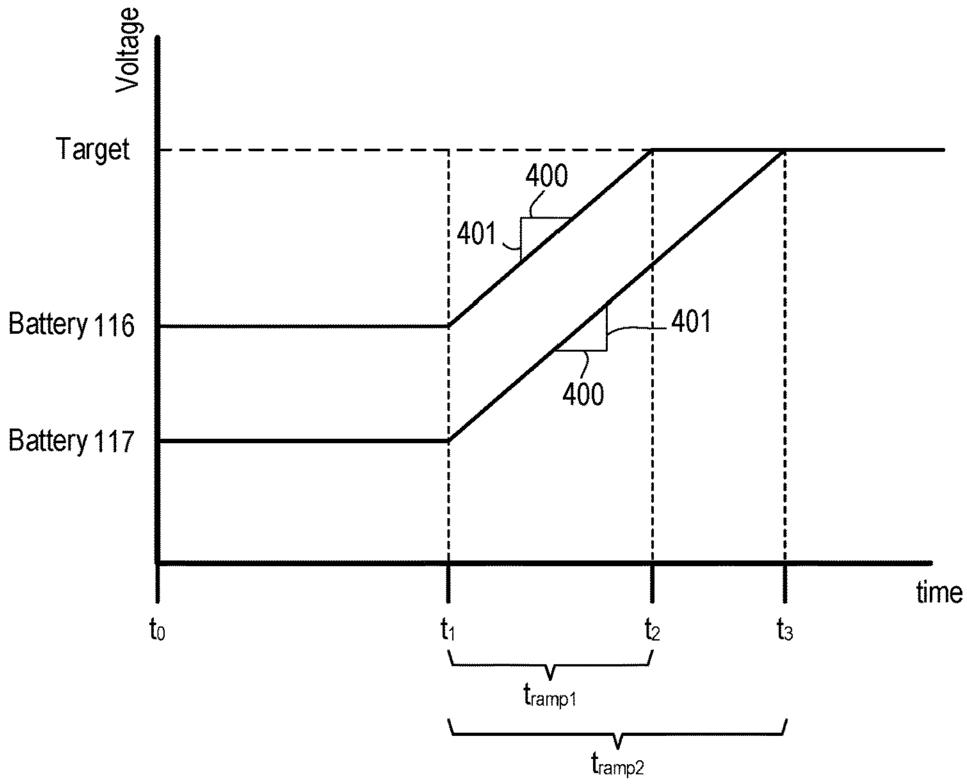
FIG. 4 illustrates a graph showing prior art BBU startup voltage waveforms according to an example.

FIG. 4 illustrates a graph showing prior art BBU startup voltage waveforms according to an example. Using batteries

116, 117 in an example of startup times in known BBU control, each battery 116, 117 is at a different SoC during a period of inactivity of the respective BBUs 112, 113 (e.g., $t_0$ to $t_1$). The period of inactivity indicates that the BBU is not controlled into a power generation state for supplying power to the rack bus system 106. During the period of inactivity, the states of charge of the batteries 116, 117 may be available at the respective DC voltage outputs 302 of the DC-to-DC power supplies 114, 115, but the available DC voltages from the BBUs 112, 113 are not output or supplied to the rack bus system 106.

At time $t_1$, an event has triggered the need to start up the BBUs 112, 113 to begin providing output power to the rack bus system 106. Since the states of charge of the batteries 116, 117 at $t_1$ are not at the level required by the rack bus system 106, the voltages of the batteries 116, 117 are boosted to the target DC system voltage (e.g., the voltage level required by the rack bus system 106). In the embodiment illustrated in FIG. 4 according to one known technique for starting multiple BBUs, both BBUs 112, 113 are simultaneously commanded to begin their startup procedures, which include boosting the voltages of the batteries 116, 117 to the target DC system voltage. As illustrated in FIG. 4, the initial SoC of the batteries 116, 117 are different. The SoC of battery 116 is higher than the SoC of battery 117. For example, the SoC of battery 116 may be 42V, and the SoC of the battery 117 may be 38V. Various reasons such as previous use cases and battery characteristics contribute to the different states of charge of the batteries 116, 117.

As illustrated, startup of the BBUs 112, 113 begins at the startup event at time $t_1$, and the output voltages of the BBUs 112, 113 begin to ramp toward the target DC system voltage. In the illustrated known control method for starting up the BBUs 112, 113, the slope of the voltage ramping from the respective states of charge is the same. That is, the same voltage rise 400 over rise time 401 is used to control both BBUs 112, 113. Accordingly, the ramp-up time, $t_{ramp1}$, of the BBU 112 from the SoC of the battery 116 to the target DC system voltage is shorter than the ramp-up time, $t_{ramp2}$, of the BBU 113 from the SoC of the battery 117 to the target DC system voltage. Though the output voltage of the BBU 113 does arrive at the target DC system voltage, the delay (e.g., $t_3$-$t_2$) can subject the BBU 112 to provide the full load voltage during this time. Without support from BBU 113, providing the full load voltage by the single BBU 112 can cause the BBU 112 to supply more current than it is capable of producing. As such, the BBU 112 may trigger its over current protection (OCP), which may cause the BBU 112 to stop supplying power to the rack bus system 106. In this case, the BBU 113, which arrives at the target DC system voltage after the BBU 112 has triggered its OCP, becomes the sole supply of current to the rack bus system 106, causing the BBU 113 to also trigger its OCP. As such, both BBUs 112, 113 cease providing power to the rack bus system 106, which fails to supply power to the equipment 102, 103, 104 as a result.

In addition, a desired characteristic of the battery backup shelf 111 to take over power generation in response to a voltage loss from the power shelf 109 (e.g., such as a loss of input AC power) may include providing backup power within a fixed startup time. In FIG. 4, for example, a full SoC battery such as battery 116 may satisfy a startup time equal to the ramp-up time, $t_{ramp1}$. The startup time of the BBU 113 due to the lower SoC of the battery 117 would, therefore, likely fail the desired startup time characteristic.

According to embodiments of this disclosure, adaptive startup rates are determined for each individual BBU 112, 113 to avoid both triggering the OCP modes and failing to start up on time described above with respect to FIG. 4.

Figure 5:
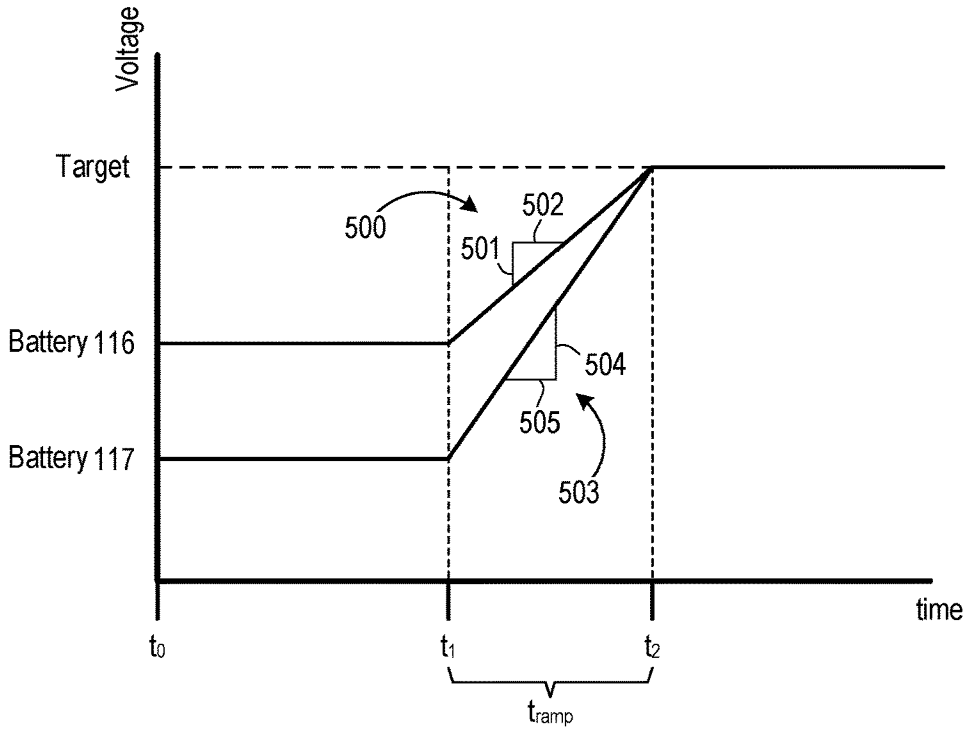
FIG. 5 illustrates a graph showing BBU startup voltage waveforms according to an embodiment.

FIG. 5 illustrates a graph showing BBU startup voltage waveforms according to an embodiment of this disclosure. As described with FIG. 4, each battery 116, 117 is at a different SoC during a period of inactivity of the respective BBUs 112, 113 (e.g., $t_0$ to $t_1$). At time $t_1$, an event has triggered the need to start up the BBUs 112, 113 to begin providing output power to the rack bus system 106. Since the states of charge of the batteries 116, 117 at $t_1$ are not at the level required by the rack bus system 106, the voltages of the batteries 116, 117 are boosted to the target DC system voltage (e.g., the voltage level required by the rack bus system 106). In contrast to the constant ramp-up slope control of FIG. 4, startup controls of the BBUs 112, 113 are individually calculated and controlled so that the target DC system voltage is reached at substantially the same time from the startup command at time $t_1$ to the end of the startup period at time $t_2$ notwithstanding the differences in the states of charge of the batteries 116, 117.

Figure 6:
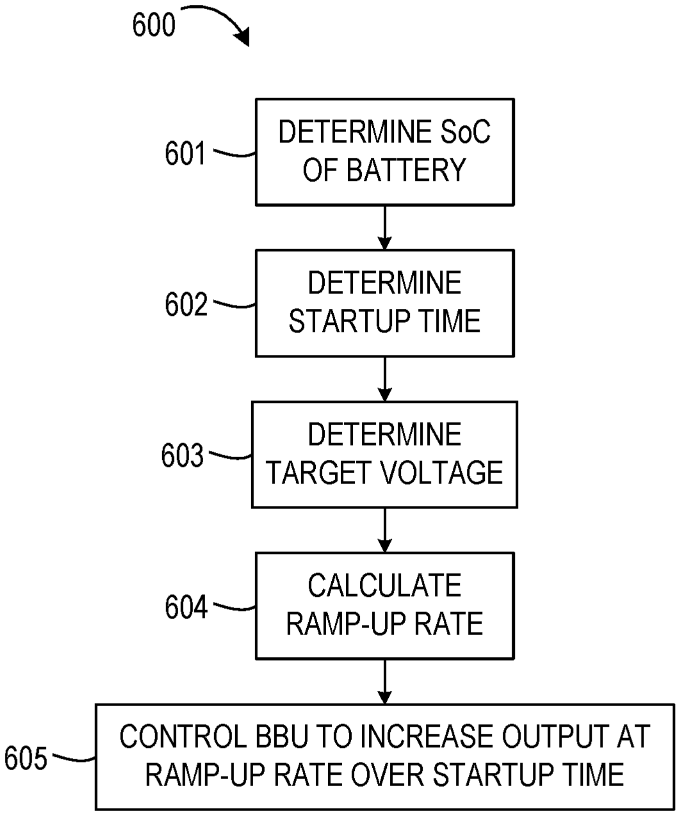
FIG. 6 illustrates a startup method for controlling the startup or ramp-up times of the BBUs of FIG. 1 according to an embodiment.

FIG. 6 illustrates a startup method 600 for controlling the startup or ramp-up times of the BBUs 112, 113 according to an embodiment. The startup method 600 is independently executed in each BBU 112, 113. Execution of the startup method 600 may begin, for example, in response to receiving a command to begin startup from a system controller of the equipment rack 100 or from a detection of power loss from the power shelf 109.

Referring to both FIGS. 5 and 6, a controller such as the controller 309 within the DC-to-DC power supply 114 or 115 determines (step 601) the SoC of the BBU battery (e.g., battery 116 or 117). Determining the SoC of the battery includes determining the voltage level of the battery prior to controlling the respective DC-to-DC power supply 114 or 115 begin ramping up the battery voltage. As illustrated, similar to FIG. 4, the SoC of battery 116 is higher than the SoC of battery 117. For example, the SoC of battery 116 may be 44V, and the SoC of the battery 117 may be 40V.

At step 602, the startup time (e.g., tramp) is determined. The startup time may be obtained from memory specifying operating conditions, for example. In one embodiment, the startup time is determined to satisfy predetermined startup conditions. For example, a startup time may be specified to be shorter than a maximum allowed time of power loss experienced by the equipment 102, 103, 104. At step 603, the target DC system voltage is determined such as, for example, by obtaining the target value from the same memory specifying operating conditions as the startup time. The target DC system voltage is the desired operating voltage value of the rack bus system 106 to provide power to the equipment 102, 103, 104. In examples herein, the target system voltage may be 48V. However, other voltages are contemplated based on the power needs of the equipment 102, 103, 104 and may be higher or lower than 48V. Such target voltage values are considered to be within the scope of this disclosure.

The ramp-up rate during the startup time is determined or calculated at step 604. The ramp-up rate is based on the determined battery SoC (step 601), startup time (step 602), and target voltage (step 603). In one example, the ramp-up rate may be determined based on the following equation:

$$\text{Ramp-up Rate} = \frac{(V_{target} - V_{batt})}{t_{target}}, \quad \text{(Eqn. 1)}$$

where $V_{target}$ is the voltage level of the target output voltage, $V_{batt}$ is the voltage level of the battery voltage source, and $t_{target}$ is the startup time. As shown in FIG. 5, the ramp-up rate 500 of the battery 116 based on the voltage rise 501 over the rise time 502 is less than or slower than the ramp-up rate 503 of the battery 116 based on the voltage rise 504 over the rise time 505. Given a target output voltage of 48V, a target time of 3 ms, and the battery voltages of 44V and 40V as specified above, respective ramp-up times for the BBUs 112, 113 may be calculated to be 1.33 V/ms and 2.66 V/ms.

At step 605, the controller begins control of the BBU to increase its output at the respective ramp-up rate 500, 503 individually calculated for the BBU. Controlling the BBU includes controlling the respective power switch or switches (e.g., switch 306) using pulse-width modulation (PWM) signals (see FIG. 3), for example, to boost the input voltage. The determined ramp-up rate is used to control the BBU over the startup time $t_{ramp1}$ to boost the battery voltage to the target DC system voltage. Such control changes the operating status of the BBUs from an inactive status to an active status. In the multi-BBU system disclosed herein, both BBUs 112, 113 simultaneously begin their startup control and arrive at the target DC system voltage at the same time or substantially the same time. In this manner, neither BBU 112, 113 is responsible for carrying the entire current load demanded by the equipment 102, 103, 104 for a sufficient time to enter its OCP mode. Due to the larger difference between its SoC value and the value of the target DC system voltage, the ramp-up rate 503 of the BBU 113 raises the level of its output voltage faster than the BBU 112. However, both BBUs 112, 113 arrive at the target DC system voltage on time as described.

Benefits of this disclosure provide for simultaneous reaching of the target output voltage despite differences in BBU battery voltage states of charge. Thus, OCP modes may be avoided by reducing the ramp-up time difference of the BBUs and allowing them to share current at the same time.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the invention is not to be seen as limited by the foregoing description but is only limited by the scope of the appended claims.

The invention claimed is:

1. A power supply unit comprising a first battery backup unit and a second battery backup unit, each of the first and second battery backup units comprising:

a power converter configured to convert a voltage of a battery into an output voltage; and a controller configured to:

determine a voltage of the battery;

determine a ramp-up time;

determine a ramp-up rate based on the voltage of the battery and the ramp-up time; and control the power converter to ramp the output voltage to a target voltage from the voltage of the battery.

2. The power supply unit of claim 1, wherein the voltage of the battery of the first battery backup unit is different from the voltage of the battery of the second battery backup unit.

3. The power supply unit of claim 2, wherein the ramp-up rate of the first battery backup unit is different from the ramp-up rate of the second battery backup unit.

4. The power supply unit of claim 3, wherein the controllers of the first and second battery backup units are configured to simultaneously control the respective power converters of the first and second battery backup units to ramp the output voltages of the first and second battery backup units to the same target voltage.

5. The power supply unit of claim 3, wherein the voltage of the battery of the first battery backup unit is greater than the voltage of the battery of the second battery backup unit; and wherein the ramp-up rate of the first battery backup unit is less than the ramp-up rate of the second battery backup unit.

6. The power supply unit of claim 2, wherein the target voltage is greater than the voltages of both of the batteries of the first and second battery backup units.

7. The power supply unit of claim 1, wherein the controllers, in being configured to determine the ramp-up rates, are configured determine the ramp-up rates based on the equation:

$$\text{Ramp-up Rate} = \frac{(V_{target} - V_{batt})}{t_{target}},$$

wherein $V_{target}$ is the voltage level of the target voltage, $V_{batt}$ is the voltage level of the respective battery of the first and second battery backup units, and $t_{target}$ is the ramp-up time.

8. The power supply unit of claim 1, wherein the ramp-up time comprises a startup time over which the first and second battery backup units are controlled from an inactive status to an active status supplying the target voltage.

9. The power supply unit of claim 1, wherein each of the first and second battery backup units further comprise a boost converter controllable by the respective controllers to ramp up the voltages of the respective batteries to the target voltage.

10. A method of controlling a startup of multiple battery backup units (BBUs) of a power supply comprising:

determining a startup time;

determining a voltage of a battery of a first BBU;

determining a voltage of a battery of a second BBU;

determining a ramp-up rate of the first BBU based on the voltage of the battery of the first BBU and the startup time;

determining a ramp-up rate of the second BBU based on the voltage of the battery of the second BBU and the startup time;

controlling the first BBU to start up over the startup time based on the ramp-up rate of the first BBU to produce a target output voltage at an end of the startup time; and controlling the second BBU to start up over the startup time based on the ramp-up rate of the second BBU to produce the target output voltage at the end of the startup time.

11. The method of claim 10, wherein the voltage of the battery of the first BBU is greater than the voltage of the battery of the second BBU.

12. The method of claim 11, wherein the voltages of the batteries of the first and second BBUs are lower than the target output voltage.

13. The method of claim 11, wherein the ramp-up rate of the first BBU is slower than the ramp-up rate of the second BBU.

14. The method of claim 10, wherein determining the ramp-up rates of the first and second BBUs comprise dividing a difference between the target output voltage and the respective voltages of the batteries by the ramp-up rate.

* * * * *